(12) United States Patent
Hoogerbrugge

(10) Patent No.: US 9,369,812 B2
(45) Date of Patent: Jun. 14, 2016

(54) WIRELESS RECEIVER CIRCUIT AND METHOD

(71) Applicant: NXP B.V., Eindhoven (NL)

(72) Inventor: Jan Hoogerbrugge, Eindhoven (NL)

(73) Assignee: NXP B.V., Eindhoven (NL)

( * ) Notice: Subject to any disclaimer, the term of this patent is extended or adjusted under 35 U.S.C. 154(b) by 194 days.

(21) Appl. No.: 14/086,865

(22) Filed: Nov. 21, 2013

(65) Prior Publication Data
US 2014/0140442 A1    May 22, 2014

(30) Foreign Application Priority Data

Nov. 22, 2012    (EP) ..................................... 12193916

(51) Int. Cl.
| | | |
|---|---|---|
| *H04L 5/12* | (2006.01) | |
| *H03M 13/03* | (2006.01) | |
| *H04R 25/00* | (2006.01) | |
| *H04B 1/10* | (2006.01) | |
| *H03M 13/00* | (2006.01) | |
| *G06F 1/32* | (2006.01) | |
| *H04L 1/00* | (2006.01) | |
| *H04L 1/20* | (2006.01) | |

(52) U.S. Cl.
CPC ............ *H04R 25/453* (2013.01); *G06F 1/3296* (2013.01); *H03M 13/00* (2013.01); *H04B 1/1018* (2013.01); *H04L 1/0045* (2013.01); *H04L 1/0053* (2013.01); *H04L 1/203* (2013.01); *H04L 1/208* (2013.01); *Y02B 60/1285* (2013.01)

(58) Field of Classification Search
CPC .. H04R 25/505; H04R 2225/61; H04R 25/30; H04R 2460/03
USPC ........................................... 375/261; 714/795
See application file for complete search history.

(56) References Cited

U.S. PATENT DOCUMENTS

| | | | | |
|---|---|---|---|---|
| 5,469,452 A | * | 11/1995 | Zehavi | H03M 13/25 714/792 |
| 5,968,199 A | * | 10/1999 | Khayrallah | H03M 13/00 714/780 |
| 8,009,090 B2 | * | 8/2011 | Vishin | G01S 19/34 342/357.63 |
| 2004/0264561 A1 | * | 12/2004 | Alexander | H04L 25/0204 375/232 |
| 2005/0096030 A1 | * | 5/2005 | Boyd | G08B 21/24 455/419 |
| 2005/0286658 A1 | * | 12/2005 | Hasebe et al. | 375/341 |
| 2006/0050812 A1 | * | 3/2006 | Hietala | H04L 27/2017 375/308 |
| 2008/0155372 A1 | * | 6/2008 | Kravitz et al. | 714/752 |
| 2013/0188814 A1 | * | 7/2013 | Andersen et al. | 381/316 |
| 2013/0272448 A1 | * | 10/2013 | Moon | H04B 7/0413 375/298 |

FOREIGN PATENT DOCUMENTS

| | | |
|---|---|---|
| WO | 98/49800 | 11/1998 |
| WO | 2007/049100 A1 | 5/2007 |

OTHER PUBLICATIONS

Extended European Search Report for Patent Appln. No. 12193916.9 (May 6, 2013).

(Continued)

*Primary Examiner* — Chieh M Fan
*Assistant Examiner* — Sarah Hassan

(57) ABSTRACT

A circuit and a method are used estimate quality of the output of a wireless receiver. This quality measure is used to control the supply voltage and thereby provide power savings.

12 Claims, 3 Drawing Sheets

(56) References Cited

OTHER PUBLICATIONS

Natarajan, J. et al. "Aggressively Voltage Overscaled Adaptive RF Systems Using Error Control at the Bit and Symbol Levels", IEEE International On-Line Testing Symposium, pp. 249-254 (Jun. 2009).
Ernst, D. et al. "Razor: A Low-Power Pipeline Based on Circuit-Level Timing Speculation", IEEE/ACM International Symposium on Microarchitecture, pp. 7-18 (2003).
Das, S. et al. "RazorII: In Situ Error Detection and Correction for PVT and SER Tolerance", IEEE Journal of Solid State, vol. 44, No. 1, pp. 32-48 (2009).
Hegde, R. et la. "Soft Digital Signal Processing", IEEE Transactions on Very Large Scale Integration, vol. 9, No. 6, pp. 813-823 (2001).
Liu, Y. et al. "On the Selection of Arithmetic Unit Structure in Voltage Overscaled Soft Digital Signal Processing", IEEE International Symposium on Low Power Electronics and Design, pp. 250-255 (2007).
Smit, L. T. et al. "Soft Output Bit Error Rate Estimation for WCDMA", Personal Wireless Communications: IFIP-TC6 8$^{th}$ International conference, 10 pgs, retrieved from the internet at: doc.utwente.nl/46353/1/smitl_pwc03.pdf (2003).
Krimer, E. et al. "Lane Decoupling for Improving the Timing-Error Resiliency of Wide-SIMD Architectures", Annual International Symposium on Computer Architecture, pp. 237-248 (2012).
Brehm, C. et al. "A case Study on Error Resilient Architectures for Wireless Communication", Proceedings of the 25$^{th}$ International Conference on Architecture of Computing Systems, 12 pgs (2012).

* cited by examiner

WIRELESS RECEIVER CIRCUIT AND METHOD

CROSS-REFERENCE TO RELATED APPLICATIONS

This application claims the priority under 35 U.S.C. §119 of European patent application no. 12193916.9, filed on Nov. 22, 2012, the contents of which are incorporated by reference herein.

The invention relates to wireless receiver circuits, and relates in particular to the desire to reduce power consumption in such circuits.

Reducing the supply voltage of digital circuits is one of the most effective methods to reduce power because of the quadratic relation between power and supply voltage. The invention thus relates to voltage variation tolerance and error resilience in a low power wireless receiver.

The supply voltage has to be sufficiently high such that circuits are fast enough to meet the setup timing. The required voltage depends on several varying parameters for which worst case assumptions are typically made at design time. The result is that circuits are typically operating at a higher voltage than strictly necessary. This margin, or guardband, is expensive in terms of power and tends to increase with more advanced process nodes and lower voltages.

In order to eliminate voltage margins, it is necessary to detect dynamically what the minimal voltage is by detecting the occurrence of setup timing errors. Razor flip-flops are a well-known technique to detect setup timing errors, as disclosed in D. Ernst et. al., "Razor: a low-power pipeline based on circuit-level timing speculation," in *Microarchitecture, 2003. MICRO-36. Proceedings. 36th Annual IEEE/ACM International Symposium on*, December 2003, pp. 7-18.

These flip-flops detect the situation where the incoming data is arriving after the setup time and have the possibility to correct the error. Application of setup timing error detection and correction makes it possible to operate circuits at a voltage below the minimal voltage required for timing-error free operation. This is known as voltage overscaling.

Voltage overscaling can be applied to programmable processors where errors are corrected after detection so that the software is unaware of the timing errors. Voltage overscaling can also be applied to systems where at the output the quality does not have to be perfect. Digital signal processing systems often fall in this category as the signal is never perfect due to noise. In these systems, voltage overscaling without timing error correction can be applied such that timing errors result in reduced quality the output as long as the quality level stays within specified limits. One type of system where this applies and where low power is often one of the main targets is digital baseband processors for wireless communication.

Voltage overscaling research can be categorized into two categories depending on the type of design it is applied to. The first category of work relates to programmable processors where the timing errors should be transparent for the software that runs on the processor. Voltage overscaled processors therefore have to accurately detect and correct timing errors. The foundation work in this area has been done by the Razor project where the Razor flip-flops discussed above are used to detect that signals arrive too late for the setup time of the receiving flip flop. The flip-flops detect this condition and are able to correct it locally.

The local error detection propagates to the rest of the processor pipeline to stall the pipeline for one cycle so that the local error can be corrected. The second generation Razor, called RazorII, is aimed at higher clock frequencies that were not possible with the first generation. In order to achieve this, RazorII no longer locally corrects the timing error and stalls the pipeline, but it restarts the pipeline from the erroneous instruction.

The second category of voltage overscaling research comprises DSP blocks where the output does not have to be exact. Initial work in this area is disclosed in R. Hegde and N. Shanbhag, "Soft digital signal processing", *Very Large Scale Integration (VLSI) Systems, IEEE Transactions on*, vol. 9, no. 6, pp. 813-823, December 2001.

This article discloses the application of voltage overscaling to FIR filters where they monitor the output of the filter and attempt to correct errors at the output caused by timing errors.

The problem of BER estimation has been considered, for example by L. T. Smit et. al., in "Soft output bit error rate estimation for wcdma," in *Personal Wireless Communications: IFIP-TC6 8th International Conference, PWC 2003*, Venice, Italy, Sep. 23-25, 2003, ser. Lecture Notes in Computer Science; 2775. Springer, 2003, pp. 448-457. This article discloses the control of various parameters in a communication stack. Statistical information is used about the soft bits that are produced by a RAKE receiver.

This technique is therefore not suitable for a receiver design that does not produce soft bits.

There is therefore a need for a system for implementing a voltage overscaling function based on an output bit stream of a receiver.

According to the invention, there is provided an apparatus and method as defined in the independent claims.

One aspect of the invention provides a wireless receiver circuit comprising:

a receiver unit having a power supply at a drive voltage and providing an output as a stream of digital output bits;

a forward error correction decoder at the output of the receiver unit;

a forward error correction encoder at the output of the forward error correction decoder for re-encoding the output of the forward error correction decoder;

a means for determining, from the received encoded signal at the output of the wireless receiver unit and from the re-encoded signal at the output of the forward error correction encoder, a measure of the amount of error correction required;

a control unit for deriving a control output based on a comparison of the obtained measure of the amount of error correction and a target value; and a voltage regulator for providing the drive voltage to the wireless receiver unit, in dependence on the control unit output.

The invention relates to a voltage overscaling process for a wireless receiver unit. A control loop controls the supply voltage based on an estimated output quality and a target output quality. The output quality is derived from an evaluation of the forward error correction that had to be applied to the received signal.

The means for determining a measure of the amount of error correction required can comprise a unit for measuring Hamming distance, and the target value comprises a target Hamming distance.

The circuit can further comprise a quantizer between the control unit and the voltage regulator.

The invention is of particular interest for a battery operated device such as a hearing aid.

In another aspect, the invention provides a method of controlling a drive voltage to a wireless receiver unit, comprising:

performing a forward error correction decoding step on the output of a wireless receiver unit;

performing a forward error correction encoding step for re-encoding the results of the forward error correction decoding step;

determining, from the received encoded signal at the output of the wireless receiver unit and from the re-encoded signal provided by the forward error correction encoding step, a measure of the amount of error correction required;

deriving a control output based on a comparison of the obtained measure of the amount of error correction and a target value; and providing a drive voltage to the wireless receiver unit, in dependence on the control unit output.

Examples of the invention will now be described in detail with reference to the accompanying drawings, in which.

The invention provides a method to estimate quality of the output of a wireless receiver and to use this to control the supply voltage.

In this way, the power consumption, for example of digital baseband processing, of a wireless receiver can be reduced by operating the circuit at a reduced voltage. Setup timing errors can be allowed to occur occasionally in a controlled way. The invention involves estimation of the BER of the receiver to enable a control loop to be created that controls the voltage such that the estimated BER is within the specifications of the system.

The quality is based on error detection by means of evaluating a forward error correction function for use in communication systems with such forward error correction (FEC). By recoding the bits that are produced by a FEC decoder and comparing those with the coded (soft) bits that entered the FEC decoder, an indication of how many errors have been corrected by FEC can be obtained which is related to the quality of the decoded bits after FEC decoding.

Another method disclosed below involves the use of a parity check. The BER and packet length are directly related to the parity error rate so that the parity error rate can also be used for controlling the BER.

The level of timing error that can be tolerated by voltage overscaling depends on the SNR of the wireless channel.

A higher SNR in the wireless channel allows for more errors at the output of the receiver due to voltage overscaling. Therefore, a higher SNR results in lower power consumption.

The system can thus adapt itself therefore to both the conditions of the silicon, e.g., temperature, as well as the conditions in the wireless channel.

The approach of the invention has been modelled in a simulation model of an industrial quality low power receiver. Measurements show that the control loops accurately control the voltage to the minimal level necessary for the specified quality. Power reductions for the digital processing are obtained up to 44%, depending on the SNR in the channel and the applied voltage control method.

The invention is based on understanding how the functional correctness of a digital circuit behaves as the supply voltage is reduced.

Figure 1:
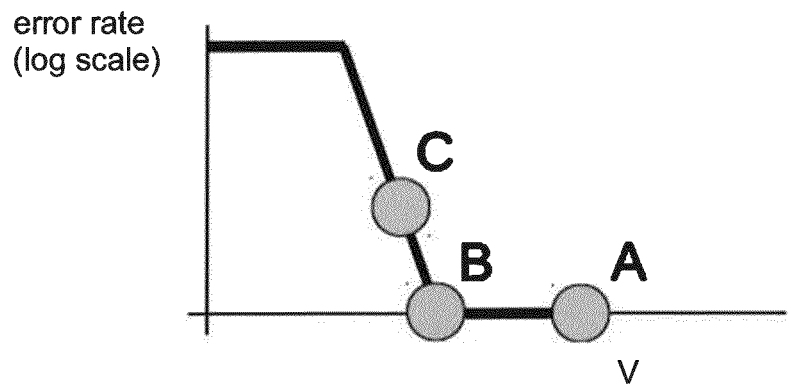
FIG. 1 shows how the error rate of a circuit varies in dependence on the power supply voltage.

FIG. 1 shows the relation between error rate and the supply voltage.

In particular, FIG. 1 illustrates what happens when the voltage on a computational block, such as a multiplier, is lowered.

Starting at a voltage point A, where no timing errors occur, the error rate of the block will be zero. When the voltage is gradually lowered to point B the first error is observed at the output. This point is defined by the critical path through the block. The rate at which errors occur at point B can be extremely low. When the voltage is reduced even further to point C an exponential increase in error rate is seen as the voltage is lowered. The coefficient behind this exponential increase determines how gracefully the block degrades in correctness.

The difference in voltage between point A and B is the guardband that is applied to deal with parameter variation, because the location of point B is not known at design time. The difference between B and C is the power reduction that can be achieved when the system is able to deal with the error rate corresponding to point C. Finally, the difference between A and C corresponds to the total power reduction that can be obtained by enabling operation at point C.

In the system of the invention, voltage overscaling is applied by means of a control loop that keeps the quality of the receiver at a specified level. For a receiver, quality is measured as the bit error rate (BER). If the quality is below a specified level then the voltage should be increased while if it is above specified level the voltage can be decreased.

Because the exact BER cannot be determined at the transceiver side, an indicator is needed that directly relates to BER.

Figure 2:
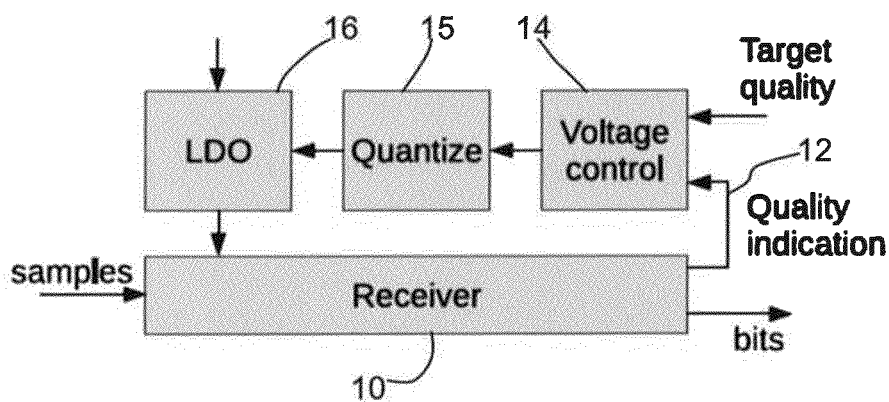
FIG. 2 shows generically a circuit for controlling the power supply voltage using a feedback based on an error measurement.

FIG. 2 shows how voltage overscaling works in the context of a receiver. The receiver 10 translates a stream of samples coming from the AD convertor into a stream of data bits. For voltage overscaling the receiver outputs a quality indicator 12 as well. A control unit 14 compares the quality indicator with a target quality value and adjusts its output to steer the quality indicator value into the direction of the target quality value.

The output of the control unit is passed to an LDO (low-dropout) regulator 16 which generates the supply voltage corresponding to the value requested by the control unit.

A quantizer 15 between the voltage controller and the LDO voltage regulator converts the control unit output to a level that the LDO regulator can generate.

An essential constraint for voltage overscaling is that error generation should be graceful. In other words, if the supply voltage is slightly too low then the BER should not directly jump to 50% or, for example, the receiver should not lock itself. Therefore, a distinction is made between timing error resilient (TER) and non timing error resilient (NTER) parts, where timing errors in TER parts lead to a slight degradation in the output quality and timing errors in NTER parts could lead to more catastrophic results.

If the voltage overscaling scales the voltage between Vmin and Vmax where Vmax is the supply voltage level where timing errors are guaranteed not to happen, then there are two options:

1) Use Vmax for the NTER parts and the overscaled voltage for the TER parts. Level shifters might be necessary on the interfaces between TER and NTER parts.

2) Synthesize the NTER parts for Vmin so that they will always work without timing errors. In this case both TER and NTER parts use the overscaled voltage and level shifters are not necessary. However, synthesizing the NTER parts for Vmin might be a challenge or impossible.

The invention is based on the use of forward error correction, in particular the analysis of the forward error correction function to determine a measure of the errors that had to be corrected.

Before describing the approach of the invention, an alternative approach considered by the applicant will be described. This possible approach is based on the use of parity bits, in particular the addition of a parity bit to every communication packet.

Assuming an example of wireless transceiver which has programmable packet sizes of typically a few hundred bits, the overhead of the parity bit is small. Let P=1 in case of a parity error and P=0 otherwise, then:

$$E[P] = \sum_{i=1,3,5,...}^{N} \binom{N}{i} B^i (1-B)^{N-i} \quad (1)$$

where N is the packet size and B the BER. Because a parity check can only detect an odd number of errors, E[P] will be a value between 0 and 0.5.

The voltage control loop is implemented as follows:

$$V_{new} = V_{old} + (P - P_{target}) * K_i \quad (2)$$

Figure 3:
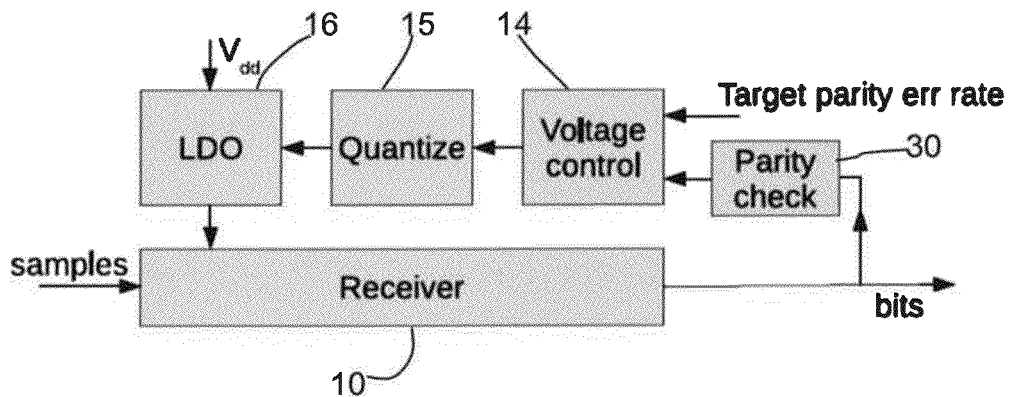
FIG. 3 shows an example of receiver circuit.

FIG. 3 shows the voltage overscaling based on parity checks where Ptarget is the target parity error rate corresponding to the target BER of the system and Ki is the integral gain parameter of a PID controller that will determine how fast the control loop converges.

The voltage is updated according to this expression after every packet reception. Notice that Ptarget is a fractional value while P is integer.

FIG. 3 shows the same basic units as FIG. 2. The output bits are provided to a parity check unit 30 which then derives the quality indication shown generically in FIG. 2.

An example of receiver to which the invention can be applied supports several physical layer modes, to enable different standards to be supported, such as Bluetooth and Zigbee. Some of these standards can apply double differential modulation (DDM). The result of DDM is that bit errors typically occur in pairs which does not match with parity based error detection which can only detect an odd number of errors. This is easily repaired by the parity protecting only the even or odd numbered bits in the packet.

A disadvantage of the parity based method is that it needs support from the transmitter, since the transmitter needs to generate the parity bit value by performing an addition. If it is incorrectly assumed that the parity bit addition has been performed, then the parity bit value will be incorrect 50% of the time. This may arise if the method is added to an existing communication standard without parity protection.

However, if it can be assumed that the parity of the payload data is uniformly distributed (e.g., due to scrambling) then E[P] will be 0.5.

In such cases, the control loop can drive the voltage to Vmax, which is the value to be used when the information is not available to perform the voltage scaling.

In this way, the receiver does not have to know whether or not the transmitter added the parity bit, and can default to no voltage scaling when the parity calculation has not been supported.

The invention is instead based on the use of a forward error correction system.

Many transceiver systems apply FEC where the transmitter adds redundancy to the data that is used by the receiver to correct errors. In case FEC is applied, use can be made to estimate the BER after FEC decoding in order to control the voltage for voltage overscaling.

If FEC decodes a bit stream C (coded) to bit stream U (uncoded) then U can be recoded again with the same FEC scheme to create a bit stream R (recoded). Comparing C and R by means of the Hamming distance H between them gives an indication of how many bits in C where corrected.

Because there is a relation between the amount of errors that are corrected and the amount of errors that pass uncorrected through the FEC decoding, we H can be used to control the voltage. Notice that FEC encoding is typically relatively inexpensive compared to FEC decoding. The control loop is similar to the parity based method:

$$V_{new} = V_{old} + (H - H_{target}) * K_i \quad (3)$$

where Htarget is the target Hamming distance corresponding to the target BER.

Figure 4:
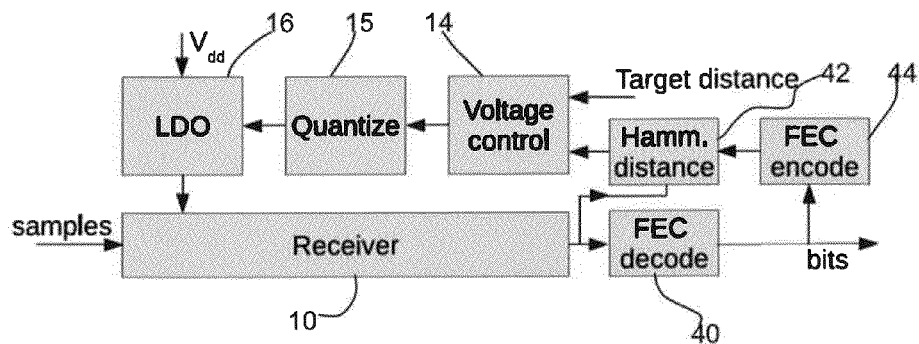
FIG. 4 shows a receiver circuit of the invention.

The system is shown in FIG. 4. FIG. 4 shows the same basic units as FIG. 2. The output bits are generated by an FEC decoder 40. These are re-encoded by encoder 42 and compared with the original received bits before decoding, by the Hamming distance calculator 44. This unit derives the quality indication shown generically in FIG. 2.

Again, Htarget is a fractional value while H is integer. In the case that C are soft bits, the Hamming distance can be generalised. This will improve the accuracy of the control loop.

The invention has been evaluated based on a particular example of low power transceiver design.

This design is a low power multi standard transceiver that works in the 2.4 GHz ISM band. It provides several physical modes for proprietary standards and open standards as Bluetooth Low Energy where the data rates vary from 250 kbps to 2 Mbps. Target applications for the design are portable medical devices such as hearing aids.

For power efficiency reasons, the digital baseband processing is implemented in dedicated hardware (as opposed to programmable DSPs). The clock speed of the modules is either 2 MHz, 8 MHz, or 16 Mhz, depending on the module and the data rate of the physical mode.

In 40 nm technology it is possible to realize timing closure at 0.6 v. Voltage overscaling will find an operating point below 0.6 v where the quality of the receiver is within specifications. The design consists of classical signal processing blocks such as FIR filters, decimation filters, correlators, CORDICs, a mixer, and Viterbi blocks together with more control oriented functions that, for example, determine the optimal down sampling moment.

The digital design for the baseband processing of is simulated (using SystemC).

The design is extended with the two methods described above and with a timing error injection model that models the behaviour of the silicon under voltage overscaling.

After careful investigation it has been found that most of the classical signal processing blocks, where most of the power is consumed, belong to the TER class while the more control oriented functions belong to the NTER class. An exception is the CORDIC that computes the carrier frequency offset based on the preamble correlator output. If that computation is wrong then the whole packet will be wrong because the carrier frequency correction applied to every sample was wrong.

How to ensure that all functions in the NTER class are free of timing errors has been discussed above.

Setup timing errors will occur on the critical and near critical paths of the design. Where critical paths are located in the design is of course design dependent. To avoid making assumptions on the locations of critical paths, the occurrence of timing errors is modelled in almost all parts that are timing error resilient. Timing errors are injected after every stage of all FIR filters, after the cost update in the Viterbi demodulator, the outputs of the correlators, and the outputs of all CORDICs, except the CORDIC that is used to calculate the carrier frequency offset.

Timing errors are injected at these locations according to the model described in the article by E. Krimer et. al., "Lane decoupling for improving the timing-error resiliency of wide-simd architectures," in *Computer Architecture (ISCA), 2012 39th Annual International Symposium on*, June 2012, pp. 237-248:

$$P_{error}(V) = \begin{cases} E \cdot 10^{(V_{critical}-V)/S} & \text{if } V \leq V_{critical} \\ 0 & \text{if } V > V_{critical} \end{cases} \quad (4)$$

where Vcritical is the critical voltage at which timing errors start to occur, E is the error rate at the critical voltage, and S is voltage decrease that will increase the error rate by a factor of 10.

The S parameter determines the degree of graceful degradation, where a larger value corresponds to more gracefulness. For the analysis provided, Vcritical=0.55 v, E=$10^{-6}$, and S=30 mv.

Timing closure is possible at 0.6 v so this corresponds to Vmax. Krimer uses his model to model the failure of processor operations. Which bit of the output of an operation will fail is not relevant for Krimer; the complete operation will be re-executed anyway. In this case each bit is modelled individually which is important as errors in more significant bits are likely to have a higher impact on the output of the receiver as well as being more likely to occur due to carry propagation towards more significant bits.

Therefore, the following model is used as a refinement on Krimer's model:

$$P_{error}(v, b) = \frac{b}{W} P_{error}(v) \quad (5)$$

where b is the bit position and W the word size of the operation.

This models that timing errors are more likely to occur in the higher bits. Injecting a timing error is modelled by repeating the bit value from the previous clock cycle.

A low drop out (LDO) voltage regulator has to generate the overscaled voltage specified by the voltage control unit. The LDO can be modelled with a latency of 0.5 ms, which roughly equals the duration of a packet transmission, and a resolution of 2 mV.

Both are realistic parameter values, especially because the accuracy of the LDO is not important. The voltage control loop will compensate an offset in the output voltage of the LDO. Also, non-equal distance voltage steps of the LDO can be handled.

The LDO resolution of 2 mV combined with the S parameter of Equation 4 results in timing error probability steps of about 17% (102 mV/S), i.e., decreasing the overscaled voltage to one LDO level lower leads to a timing error rate increase of 17%.

The results of the simulation will now be discussed.

Quality Targets and Channel Conditions

As mentioned above, one of the primary target applications of the transceiver used in the model is hearing aids. For this application a digital audio signal is transmitted where the audio codec can handle a maximum BER of about 0.1%. The transceiver is used in a 2 Mbps mode and AWGN (additive white Gaussian noise) wireless communication channel is used. Without voltage overscaling and without FEC a BER of 0.1% can be reached with an Eb/N0 (the energy per bit to noise power spectral density ratio) of 10 dB in the wireless channel.

Obviously, a higher Eb/N0 will result in a lower BER. This 'BER headroom' will be used for timing errors due to voltage overscaling. Convolutional coding with a ½ code rate is used for testing the FEC based voltage control method.

A Viterbi decoder with constraint length of 7 is used for FEC decoding. With these FEC parameters the Eb/N0 at which a BER of 0.1% is obtained is lowered to about 8 dB. Packets of 640 bits in size are used. In order to obtain a target BER of 0.1% we need a Ptarget of 0.16 and a Htarget of 8.8 for this packet size. In other words, for this packet size and target BER, a parity error happens in 16% of the packets and FEC corrects about 8.8 coded bits per packet.

A value of Ki of 2-9 is used for the parity based method and a Ki of 2-12 for the FEC based method. These values have been determined empirically where the accuracy of the control loop is balanced against the convergence speed.

Convergence

The purpose of the voltage control loop is to determine the voltage that is necessary to obtain the target BER without knowing the wireless channel conditions and without knowing the critical voltage Vcritical.

Figure 5:
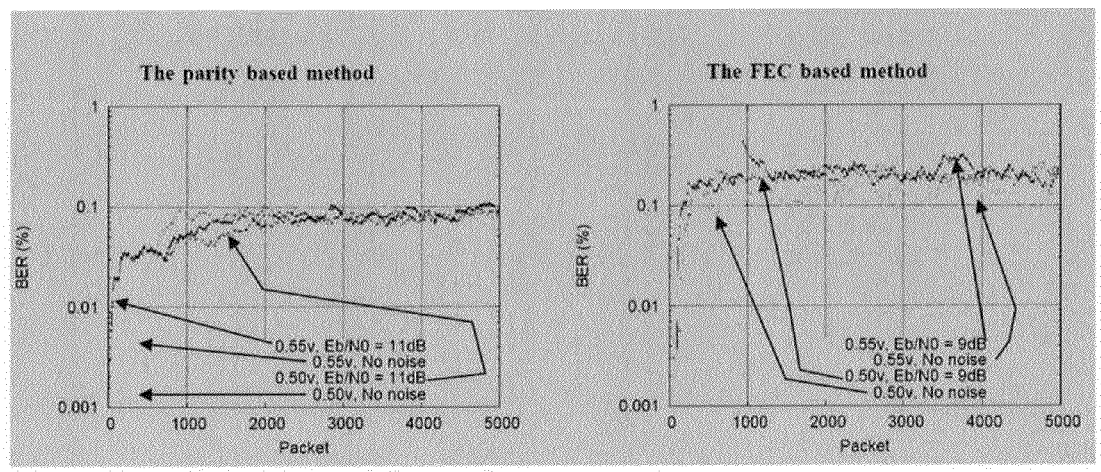
FIG. 5 shows how the error rate is stabilised by the feedback loop for different noise levels and different critical voltages for the two methods.

FIG. 5 shows the convergence of the BER to the target BER for a noiseless and a noisy channel, and a critical voltage of 0.55 v and 0.50 v.

For the parity based method (without FEC), the noisy channel has a Eb/N0 of 11 dB while for the FEC based method a value of Eb/N0 of 9 dB is used. The simulations start with a voltage of 0.6 v. The results show that both methods nicely converge to the target BER of 0.1% where the FEC method seems to converge faster.

Figure 6:
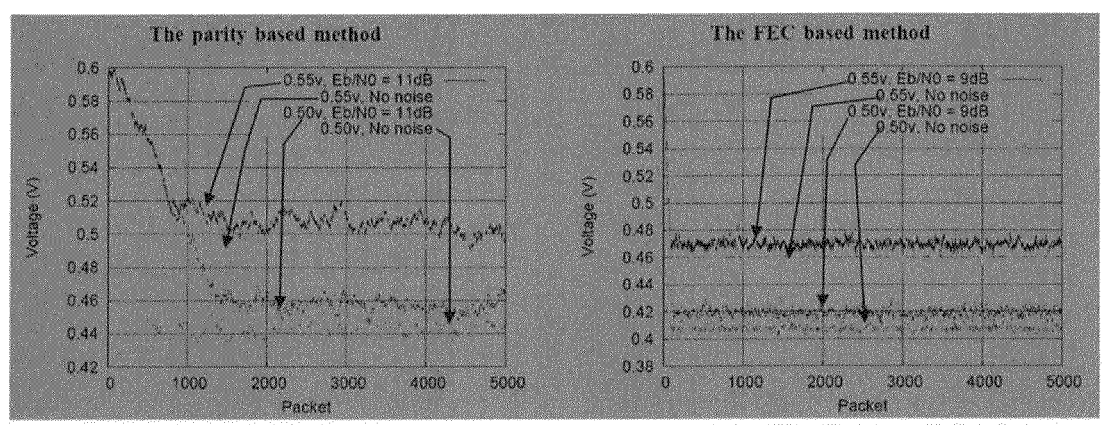
FIG. 6 shows the voltage achieved by the feedback loop for different noise levels and different critical voltages for the two methods.

FIG. 6 shows the voltage corresponding to FIG. 5 and thus shows the overscaled voltage while converging to the target BER for a noisy channel and a noiseless channel, and for Vcritical=0.50 v and Vcritical=0.55 v.

The voltage starts at Vmax and converges to the value that delivers the target BER.

A difference of 0.05 v in Vcritical results in an overscaled voltage difference of 0.05 v as well. So, the system adjusts itself to the silicon speed. It can also be seen that the system adjusts itself to channel conditions, although this is less pronounced for the FEC based method. A channel with no noise or less noise will get a lower voltage and a channel with noise.

Varying Channel Conditions

For a better understanding of how different channel conditions affect the voltage, the channel Eb/N0 is varied and the average voltage is measured, the relative power, and the number of timing errors per packet. The power is relative to the power at 0.6 v assuming that all parts of the receiver have been voltage overscaled.

Tables I and II below show the results where the value Eb/N0 is varied starting at the point where the system without voltage overscaling reaches about 0.1% BER.

TABLE I
MEASURED RESULTS FOR THE PARITY BASED METHOD

| Eb/N0 (dB) | Voltage (v) | Rel. power (%) | Timing errors per packet |
|---|---|---|---|
| 10 | 0.597 | 99.11 | 0.00 |
| 11 | 0.499 | 69.18 | 23.70 |
| 12 | 0.488 | 66.21 | 48.84 |
| 13 | 0.487 | 65.90 | 53.02 |
| 14 | 0.485 | 65.40 | 59.92 |
| 15 | 0.485 | 65.26 | 62.08 |

TABLE II
MEASURED RESULTS FOR THE FEC BASED METHOD

| Eb/N0 (dB) | Voltage (v) | Rel. power (%) | Timing errors per packet |
|---|---|---|---|
| 7 | 0.599 | 99.70 | 0.00 |
| 8 | 0.470 | 61.48 | 167.44 |
| 9 | 0.457 | 58.08 | 410.59 |
| 10 | 0.452 | 56.85 | 568.10 |
| 11 | 0.450 | 56.32 | 658.22 |
| 12 | 0.449 | 55.92 | 738.62 |

It can be seen that a better channel (less noise) results in lower voltage and power and allows for a higher timing error rate. The error correction for the FEC scheme corrects timing errors as well and allows for more voltage reduction. With the used parameters (Vmax=0.6 v, Vcritical=0.55 v, and S=30 mV) the power reductions are measured up to 35% for the parity based method and up to 44% for the FEC based method.

Varying Quality Target

The target BER is changed by changing the Ptarget and Htarget parameters. A higher target BER allows for more timing errors and a lower voltage and power.

Tables III and IV show the results of an experiment where the targets Ptarget and Htarget are scaled for the two methods for an Eb/N0 of 12 dB. It shows how the BER increases/decreases as there is an increase/decrease in the scaling of the targets. Relaxing the BER requirements allows for a lower voltage and power.

Furthermore, the experiments also show how the timing error rate increases as the voltage is lowered.

TABLE III
SCALING TARGETS FOR THE PARITY BASED METHOD

| Scaling $P_{target}$ | BER (%) | Voltage (v) | Rel. power (%) | Timing errors per packet |
|---|---|---|---|---|
| 0.25x | 0.0125 | 0.54 | 80.61 | 1.93 |
| 0.50x | 0.0356 | 0.50 | 70.83 | 15.21 |
| 1.00x | 0.0874 | 0.49 | 66.21 | 48.84 |
| 2.00x | 0.2466 | 0.47 | 62.09 | 141.13 |

TABLE IV
SCALING TARGETS FOR THE FEC BASED METHOD

| Scaling $H_{target}$ | BER (%) | Voltage (v) | Rel. power (%) | Timing errors per packet |
|---|---|---|---|---|
| 0.25x | 0.0155 | 0.47 | 60.85 | 191.82 |
| 0.50x | 0.0584 | 0.46 | 58.44 | 369.66 |
| 1.00x | 0.1767 | 0.45 | 55.92 | 738.62 |
| 2.00x | 0.7602 | 0.44 | 53.62 | 1413.62 |

In conclusion, due to parameter variation, digital circuits use a higher supply voltage than necessary for timing error free operation. Power in the baseband processing of a wireless receiver can be reduced by overscaling the voltage to a level where timing errors occur infrequently as long as the output quality of the receiver is within specifications.

Two methods have been described above to implement a control loop that minimizes the supply voltage such that the output quality is just within the specifications.

The method of the invention uses parity-based error detection, while the alternative method makes uses of FEC in the system.

The effectiveness of the concept has been demonstrated by means of simulation. Power reductions up to 44% for the digital baseband processing are measured where a stronger input signal allows for more timing errors and thus more power reduction.

The invention can be applied to any FEC technique. One example of particular FEC technique is the use of low density parity check (LDPC) codes. LDPC codes are used in several standards. Decoding an LDPC coded block is done by means of an iterative algorithm. In typical situations, the LDPC decoder gets a fixed number of iterations to do the work. Some LDPC decoders can detect that they have fixed all the errors in fewer iterations. The number of iterations that they need is an indication of the coded bitstream quality.

Therefore, the number of iterations used by a LDPC code type of FEC decoder can also be used to derive the control parameter for voltage overscaling, instead of using the measurement of Hamming distance as in the example above.

Various modifications will be apparent to those skilled in the art.

The invention claimed is:

1. A wireless receiver circuit comprising:
   a wireless receiver unit, coupled to receive a drive voltage, and configured to receive a plurality of digital samples and to output a set of encoded digital output bits;
   a forward error correction decoder coupled to receive the set of encoded digital output bits from the wireless receiver unit;
   a forward error correction encoder coupled to the forward error correction decoder and configured to re-encode output of the forward error correction decoder;
   a Hamming distance unit configured to output a measured Hamming distance between the set of encoded digital output bits from the wireless receiver unit and the re-encoded output of the forward error correction encoder;
   a voltage control unit configured to adjust the drive voltage to the wireless receiver circuit to a minimum voltage based on a difference between the measured Hamming distance and a target Hamming distance; and
   wherein the minimum voltage does not turn off the wireless receiver circuit.

2. A circuit as claimed in claim 1, further comprising a quantizer between the voltage control unit and a voltage regulator.

3. A circuit as claimed in claim 1, wherein the receiver receives a forward error correction encoded bit stream.

4. A battery operated device comprising a wireless receiver circuit as claimed in claim 1.

5. A battery operated device as claimed in claim 4 comprising a hearing aid.

6. The circuit of claim 1, wherein the minimum voltage corresponds to a voltage where the receiver circuit begins to introduce timing errors.

7. The circuit of claim 1, wherein the minimum voltage is less than a guardband voltage of the wireless receiver circuit.

8. The circuit of claim 1:
   wherein the receiver circuit includes a timing-error-resilient (TER) circuit and a non-timing-error-resilient (NTER) circuit;
   wherein the minimum voltage is less than a guardband voltage for the timing-error-resilient (TER) circuit; and
   wherein the minimum voltage is greater than or equal to the guardband voltage for the non-timing-error-resilient (NTER) circuit.

9. A method of controlling a drive voltage to a wireless receiver unit, comprising:
   implementing a voltage overscaling function for the wireless receiver unit;
   performing a forward error correction decoding step on digital output bits from the wireless receiver unit;
   performing a forward error correction encoding step for re-encoding digital output bits from the forward error correction decoding step;
   determining, from the received digital output bits from the wireless receiver unit and from the re-encoded digital output bits from the forward error correction encoding step, a measure of a Hamming distance;
   deriving a control output from a difference between the measured Hamming distance and a target Hamming distance; and
   adjusting a drive voltage to the wireless receiver unit to a minimum voltage, in dependence on the control output;
   wherein the minimum voltage does not turn off the wireless receiver circuit.

10. A method as claimed in claim 9, further comprising quantizing the control output.

11. A method as claimed in claim 9 performed in a battery operated device.

12. A method as claimed in claim 11 performed in a hearing aid.

* * * * *